(12) United States Patent
García et al.

(10) Patent No.: US 8,703,276 B2
(45) Date of Patent: Apr. 22, 2014

(54) APPARATUS, SYSTEM, AND METHOD FOR DNA SHADOW NANOLITHOGRAPHY

(75) Inventors: Héctor Alejandro Becerril García, Palo Alto, CA (US); Adam T. Woolley, Orem, UT (US)

(73) Assignee: Brigham Young University, Provo, UT (US)

( * ) Notice: Subject to any disclaimer, the term of this patent is extended or adjusted under 35 U.S.C. 154(b) by 1011 days.

(21) Appl. No.: 12/184,131

(22) Filed: Jul. 31, 2008

(65) Prior Publication Data

US 2009/0035525 A1  Feb. 5, 2009

Related U.S. Application Data

(60) Provisional application No. 60/963,011, filed on Aug. 1, 2007.

(51) Int. Cl.
*B32B 3/00* (2006.01)
*C12Q 1/68* (2006.01)
*C12M 1/00* (2006.01)
*G01N 33/00* (2006.01)

(52) U.S. Cl.
USPC ............ 428/172; 977/704; 977/941; 435/6.1; 435/283.1; 435/287.2; 422/68.1

(58) Field of Classification Search
USPC .......... 428/167, 172, 188, 364, 397; 977/704, 977/762, 887, 904, 941; 435/6.1, 283.1, 435/287.2; 422/68.1, 82.05; 257/618
See application file for complete search history.

(56) References Cited

U.S. PATENT DOCUMENTS

| | | | |
|---|---|---|---|
| 6,593,065 B2* | 7/2003 | Scherer | 430/314 |
| 2006/0046480 A1* | 3/2006 | Guo | 438/685 |

OTHER PUBLICATIONS

Xiaojun Li et al., Antiparallel DNA Double Crossover Molecules As Components for Nanoconstruction, J. Am. Chem. Soc. 1996, vol. 118, pp. 6131-6140.
Thomas H. Labean et al., Construction, Analysis, Ligation, and Self-Assembly of DNA Triple Crossover Complexes, J. Am. Chem. Soc. 2000, vol. 122, pp. 184-1860.
R.P. Goodman et al., Rapid Chiral Assembly of Rigid DNA Building Blocks for Molecular Nanofabrication, www.sciencemag.org, vol. 310, Dec. 9, 2005, pp. 1661-1665.

(Continued)

*Primary Examiner* — Donald J Loney
(74) *Attorney, Agent, or Firm* — Kunzler Law Group

(57) ABSTRACT

Nanostructures on substrates include one or more nanofeatures having unscathed walls and width dimensions of forty-five nm or less. The nanofeatures may include at least one of a nanotrench, nanocapillary, nano-chemical pattern, and nanowire. The nanostructures may include a nano object with a pattern of nano elements. A nano system may include at least one nano system device, which may include at least one nanofeature. A method of forming nanofeatures on substrates includes placing a nano-templating element on the substrate. A masking material is deposited at an acute angle to form shadow gaps on shadowed regions of the substrate. The nano-templating element, the angle, and other factors may be selected to form shadow gaps having width dimensions less than 10 nm. The substrate may be chemically modified in the areas corresponding to the shadow gaps to create nanofeatures with unscathed walls having width dimensions of less than 10 nm.

16 Claims, 5 Drawing Sheets

(56) References Cited

OTHER PUBLICATIONS

Hector A. Becerril et al., DNA-Templated Three-Branched Nanostructures for Nanoelectronic Devices, J. Am. Chem, Soc. 2005, vol. 127, pp. 282-2829.

Erik Winfree et al., Design and self-assembly of two-dimensional DNA crystals, Nature, vol. 394, Aug. 6, 1998, pp. 539-544.

Sung Ha Park, Programmable DNA Self-Assemblies for nanoscale Organization of Ligands and Proteins, Nano Letters, 2005, vol. 5, No. 4, pp. 729-733.

Junping Zhang et al., Periodic Square-Like Gold Nanoparticle Arrays Templated by Self-Assembled 2D DNA Nanogrids of a Surface, Nano Letters, 2006, vol. 6, No. 2, pp. 248-251.

Jiwen Zheng et al., Two-Dimensional Nanoparticle Arrays Show the Organizational Power of Robust DNA Motifs, Nano Letters, 2006, vol. 6, No. 7, pp. 1502-1504.

Erez Braun et al., DNA-templated assembly and electrode attachment of a conducting silver wire, Nature, vol. 391, Feb. 19, 1998, pp. 775-778.

Jan Richter, Metallization of DNA, www.sciencedirect.com, Science Direct, Physica E 16 (2003) pp. 157-173.

Ralf Seidel et al., Synthesis of Platinum Cluster Chains on DNA Templates: Conditions for a Template-Controlled Cluster Growth, J. Phys. Chem. B 2004, vol. 108, pp. 10801-10811.

Andrea Ongaro et al., DNA-Templated Assembly of Conducting Gold Nanowires between Gold Electrodes on a Silicon Oxide Substrate, Chem. Mater. 2005, vol. 17, pp. 1959-1964.

John Lund et al., Electrical conduction in 7 nm wires constructed on λ-DNA, Institute of Physics Publishing, Nanotechnology 17, 2006, pp. 2752-2757.

E.C. Jelks et al., A simple method for fabricating lines of 0.15-μ width using optical lithography, Appl. Phys. Lett. 34, Jan. 1, 1979, pp. 28-30.

Akira Sugawara et al., Self-organized Fe nanowire arrays prepared by shadow deposition on NaCl(110) templates, Applied Physics Letters, vol. 70, No. 8, Feb. 24, 1997.

C.Teichert et al., Fabrication of nanomagnet arrays by shadow deposition on self-organzied semiconductor substrates, Applied Physics Letters, vol. 74, No. 4, Jan. 25, 1999, pp. 588-590.

C.Teichert, Self-organized semiconductor surfaces as templates for nanostructured magnetic thin films, Applied Physics A, Published online: Feb. 5, 2003, pp. 653-664.

E. Tracy et al., Preparation and Characterization of Molecule-Based Transistors with a 50-nm Source-Drain Separation with use of Shadow Deposition Techniques: Toward Faster, More Sensitive Molecule-Based Devices, J. Am. Chem. Soc. 1987, vol. 109, pp. 5526-5528.

Peng Jiang et al., Wafer-Scale Periodic Nanohole Arrays Templated from Two-Dimensional Nonclose-Packed Colloidal Crystals, J. Am. Chem. Soc., 2005, vol. 127, No. 11, pp. 3710-3711.

Jennifer S. Shumaker-Parry et al., Fabrication of Crescent-Shaped Optical Antennas, Advanced Materials 2005, vol. 17, pp. 2131-2134.

Yu Lu et al., Nanophotonic Crescent Moon Structures with Sharp Edge for Ultrasensitive Biomolecular Detection by Local Electromagnetic Field Enhancement Effect, Nano Letters, 2005, vol. 5, No. 1, pp. 119-124.

M.G. Ancona et al., Patterning of Narrow Au Nanocluster Lines Using V2O5 Nanowire Masks and Ion-Beam Milling, Nano Letters, 2003, vol. 3, No. 2, pp. 135-138.

X.M. Yan et al., Fabrication of Large Number Density Platinum Nanowire Arrays by Size Reduction Lithography and Nanoimprint Lithography, Nano Letters, 2005, vol. 5, No. 4, pp. 745-748.

E.P. De Poortere et al., Single-walled carbon nanotubes as shadow masks for nanogap fabrication, Applied Physics Letters, 2006, vol. 88, pp. 143124-1-143124-3.

Adam T. Woolley et al., Deposition and Characterization of Extended Single-Stranded DNA Molecules on Surfaces, Nano Letters, 2001, vol. 1, No. 7, pp. 345-348.

* cited by examiner

| Panel | Top Width (nm) | Maximum Width (nm) | Depth (nm) |
|---|---|---|---|
| A | 7 | 22 | 40 |
| B | 15 | 43 | 110 |
| C | 27 | 43 | 385 | ered # APPARATUS, SYSTEM, AND METHOD FOR DNA SHADOW NANOLITHOGRAPHY

CROSS-REFERENCES TO RELATED APPLICATIONS

This application is a continuation-in-part of and claims priority to U.S. Provisional Patent Application No. 60/963,011 entitled "DNA Shadow Nanolithography" and filed on Aug. 1, 2007, which is incorporated herein by reference.

GOVERNMENT LICENSE RIGHTS

This invention was made with government support under Grant No. YNIHRR00 EB006124-01 awarded by National Institute of Health. The government has certain rights in the invention.

BACKGROUND OF THE INVENTION

1. Field of the Invention

Embodiments of the invention relate to formation of nanofeatures in substrates and more particularly relate to chemically formed nanofeatures having dimensions smaller than previously available.

2. Description of the Related Art

DNA is used extensively in bottom-up nanofabrication to produce discrete or periodic nanostructures with controlled morphology. Such nanoscale DNA patterns have been utilized as templates for the deposition of nanoparticles, metals, semiconductors, carbon nanotubes, proteins, etc. The properties of DNA-templated constructs are directly and sometimes adversely influenced by the nucleic acid within the assembly. For example, electroless deposition of metal on DNA typically yields granular, polycrystalline nanowires because the mesoscale uniformity of the DNA molecule promotes simultaneous, multiplexed nucleation.

One such patterning approach was reported by Deng and Mao, (see Angew. Chem. 2004, 116, 4160-4162; Angew. Chem. Int. Ed. 2004, 43, 4068-4070.), who deposited thick metal films over DNA nanostructures on mica to create imprinted metal replicas of the DNA features with nanometer resolution.

Shadow or angled deposition is a well-known microfabrication technique used to produce features smaller than those directly achievable by optical lithography. Typically, a material is either deposited through a shadow mask or onto a textured surface, which serves as its own shadow mask for certain deposition directions. Common textured surfaces used for shadow deposition include self-organized crystalline facets of NaCl, sapphire, semiconductors, and substrates with microfabricated features. More recently, nanoparticles, nanowires, and carbon nanotubes have also been utilized in shadow deposition to enhance nanofabrication resolution, and patterns with 50 nm dimensions or smaller can be made by shadow deposition techniques. (See Jiang, P., McFarland, M. J., J. Am. Chem. Soc. 2005, 127, 3710-3711; Shumaker-Parry, J. S., Rochholz, H., Kreiter, M., Adv. Mater. 2005, 17, 2131-2134; Lu, Y., Liu, G. L., Kim, J., Mejia, Y. X., Lee, L. P., Nano Lett. 2005, 5, 119-124; Ancona, M. G., Kooi, S. E., Kruppa, W., Snow, A. W., Foos, E. E., Whitman, L. J., Park, D., Shirey, L., Nano Lett. 2003, 3, 135-138; Yan, X.-M., Kwon, S., Contreras, A. M., Bokor, J., Somorjai, G. A., Nano Lett. 2005, 5, 745-748; De Poortere, E. P., Stormer, H. L., Huang, L. M., Wind, S. J., O'Brien, S., Huang, M., Hone, J., Appl. Phys. Lett. 2006, 88, 143124.)

Smaller dimensions have been achieved through non-chemical methods such as electron beam lithography that utilize expensive instruments and have a variety of drawbacks. For example, processing a substrate by electron beam lithography to form nanoscale structures can require a day or more of instrument operation. Many flaws can be introduced such as flaws in the large amounts of data being processed during the lengthy instrument operation. Also, keeping the substrate physically stable during instrument operation is more difficult for the long processing times. Furthermore, electron beam lithography causes forward and back scattering of primary and secondary electrons that can adversely affect the quality of the features being placed in the substrate. Repeatability and control at the resolution limits are poor for electron beam lithography. Because of electron scatter and the travel of primary electrons through the material of the substrate, features generally must be spaced apart to avoid "so-called" proximity effects with electron beam lithography. Nested features cause lower quality in the adjacent structures due to exposure of other features to electrons forming adjacent structures. Thus, electron beam lithography has limitations in placing a plurality of closely spaced features on a substrate and in producing walls that have not been damaged by electrons.

Another method for forming nanoscale structures is scanning probe lithography, which utilizes a stylus for contacting the substrate in either a constructive or a destructive mode. Material in the form of chemical species can be added to the substrate via the stylus for constructive modification. Alternatively in the destructive modes, the substrate is manipulated by energy imparted to the substrate through the stylus. The energy can be mechanical, thermal, photonic, ionic, electronic, or X-rays. Scanning probe lithography has drawbacks including the need to frequently change the stylus, and the potential for damage through physical contact of the stylus with the substrate. Also, the scanning probe lithography methods have inferior resolution than can be achieved by electron beam lithography.

SUMMARY OF THE INVENTION

From the foregoing discussion, it should be apparent that a need exists for an apparatus, system, and method that can utilize nucleic acid's patterning abilities, without requiring the presence of DNA during subsequent fabrication steps. Beneficially, in some embodiments such an apparatus, system, and method would overcome the granularity and polycrystalline characteristics associated with the presence of nucleic acid when DNA material remains present during deposition of metals for forming nanowires. There is a further need for the apparatus, system and method to be capable of utilizing nanoscale nucleic acid material, other nanostructures, or nano-templating elements to form shadows or shadow patterns and shadow gaps on a substrate. The substrate with shadow gaps can then be processed in accordance with known chemical modification processes.

The present invention has been developed in response to the present state of the art, and in particular, in response to the problems and needs set forth above that have not yet been fully solved by currently available methods. Accordingly, embodiments of the present invention have been developed to provide an apparatus, system, and method for shadow nanolithography using DNA or other cylindrical objects that overcome many or all of the above-discussed shortcomings in the art. Other nanostructures or nano-templating elements that have configurations other than cylindrical may alternatively or additionally be utilized for nanoscale shadow patterning.

In a simple form, an apparatus in accordance with embodiments of the present invention includes at least one nanostructure on a substrate. The nanostructure includes at least one nanofeature including at least one of a nanotrench, nanocapillary, nano-chemical pattern, and nanowire. The nanofeature also has an unscathed wall. In one embodiment, the nanofeature has a width dimension in a range from 5 to 45 nanometers. In another embodiment, the width dimension of the nanofeature is in a range from 10 to 30 nanometers. In still another embodiment, the width dimension is in a range from 5 to 10 nanometers.

The nanofeature may be one of a plurality of nanofeatures formed by a pattern of nano elements corresponding to a linear DNA template. Alternatively or additionally, the nanofeature may be one of a plurality of nanofeatures formed by a pattern of nano elements corresponding to a branched DNA template. Further alternatively or additionally, the nanofeature may be one of a plurality of nanofeatures formed by a pattern of nano elements corresponding to an assembled DNA nanostructure object.

In some embodiments, the nanofeature includes an aspect ratio of depth to width greater than 3 to 1. In other embodiments, the nanofeature has walls forming a reentrant opening in the substrate.

In another simple form, a system in accordance with embodiments of the present invention includes a nano system device. In one embodiment, the nano system device has at least one nanofeature with a width dimension less than 45 nanometers. The nanofeature also has an unscathed wall. In other embodiments, the nanofeature includes at least one of a nanowire, nanotrench, and nanocapillary having a width dimension less than 10 nanometers. In another embodiment, the nano system device includes a nano-chemical pattern that includes the nanofeature. In one embodiment, the nanofeature of the nano-chemical pattern has a width less than 10 nanometers.

The nano system device may include a sensor. The nano system device may have a nanofeature that forms at least a portion of a sensor. Alternatively or additionally, the nano system device may include at least a portion of some nanocircuitry. The nano system device may have a nanofeature that forms at least a part of the nanocircuitry in the nano system device. Here, as with other embodiments, the nanofeature may include walls that form a reentrant opening in a substrate.

In still another simple form, a method of forming one or more nanofeatures in a substrate in accordance with embodiments of the present invention includes placing at least one nano-templating element on a substrate. The nano-templating element may be any nano element having a width dimension less than 100 nanometers. The method includes depositing a masking material at an acute angle relative to the substrate, and coating the substrate and the nano-templating element by the operation of depositing. The method also includes chemically modifying exposed portions of the substrate. In another operation, the method may include removing the masking layer and the nano-templating element from the substrate.

In one embodiment, the operation of coating the substrate and the nano-templating element at an acute angle includes forming a shadow between at least a portion of the nano-templating element and the substrate. The operation of coating may also include inhibiting the coating material from being deposited in an area on the substrate corresponding to the shadow. In one embodiment, forming the shadow includes forming the shadow with a width of the shadow on the substrate that is less than the width dimension of the nano-templating element.

In some embodiments, placing the nano-templating element on the substrate may include placing at least one polymer molecule on the substrate. The method may further include placing a plurality of polymer molecules on the substrate. The plurality may be in the form of least one of a linear and a branched DNA pattern on the substrate. Alternatively or additionally, the method may include placing a plurality of polymer molecules in the form of an assembled DNA pattern on the substrate.

In some embodiments, chemically modifying includes chemically etching to form at least one of a nanotrench and a nanocapillary having a width less than 30 nanometers in the substrate. In still other embodiments, chemically modifying includes creating a nano-chemical pattern on the substrate. The nano-chemical pattern may have a width dimension less than 30 nanometers. Creating a nano-chemical pattern may include utilizing the nano-templating element to form a pattern of shadow gaps on the substrate, and chemically patterning the substrate in a pattern corresponding to the pattern of shadow gaps.

In embodiments in which the nanofeature includes a nanotrench, the method may further include depositing metal in the nanotrench to form a nanowire having a width less than 10 nanometers. The operation of etching may include forming a nanotrench having a depth and a width in the substrate with an aspect ratio in a range from 3 to 25.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any manner in one or more embodiments. The invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. The drawings depict only typical embodiments of the invention and are not therefore to be considered to be limiting of its scope. The invention will be described and explained with additional detail with reference to the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, characteristics, reagents, reaction times, temperatures, or atmospheric conditions of the invention may be combined in any suitable manner in one or more embodiments. In the following description, numerous specific details are provided, such as examples of user selections, micro devices, nano devices, hardware circuits, hardware chips, etc., to provide a thorough understanding of embodiments of the invention. One skilled in the relevant art will recognize, however, that the invention may be practiced without one or more of the specific details, or with other methods, components, materials, conditions, and so forth. In other instances, well-known structures, materials, or operations are not shown or described in detail to avoid obscuring aspects of the invention.

Figure 1A:
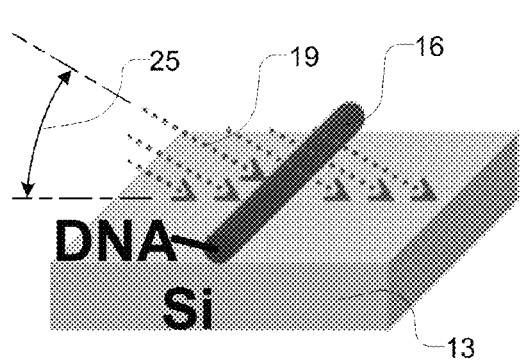
FIGS. 1A-1C are diagrammatic perspective views illustrating apparatuses and operations of a method for forming the apparatuses, in accordance with embodiments of the invention.
Figure 1B:
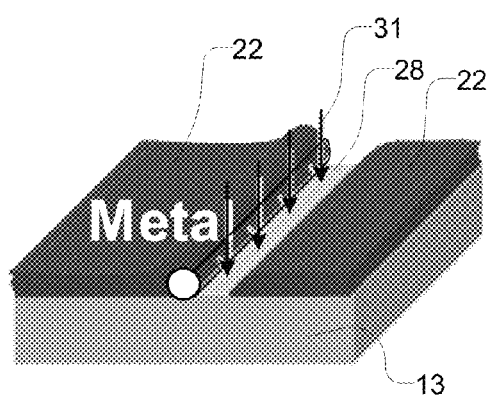
Figure 1C:
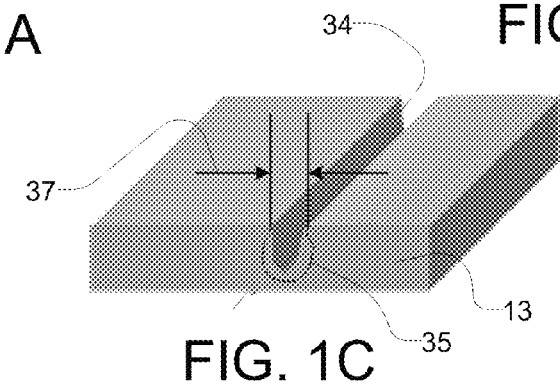

FIGS. 1A-1C are diagrammatic perspective views illustrating apparatuses and operations of a method for forming the apparatuses, in accordance with embodiments of the invention. FIGS. 1A-1C show steps in a method for texturing a silicon substrate 13 including placement of nanofeatures in the substrate 13. Approximately cylindrical structures 16 may be placed on the substrate 13, as shown in FIG. 1A, in preparation for shadow masking and etching. In one embodiment the cylindrical structures 16 may include aligned DNA molecular bundles or other nucleic acid material. In any case, the cylindrical structure(s) may be utilized to add "texture" to silicon substrates 13. The substrates 13 may be flat substrates of silicon or other material(s). Because DNA and other nucleic acid materials have very thin features, (~2-6 nm), and are structurally compact, they provide an effective nanoscale barrier to deposition in a masking operation indicated by arrows 19. Thus, when a thin metal film 22 (shown in FIG. 1B), and/or other film(s) are vapor deposited at an appropriate angle 25, the DNA or other cylindrical structure serves as a "nanostencil" that patterns the film 22 with one or more shadow gaps 28. The shadow gaps 28 correspond to regions on the substrate 13 in which the film 22 was blocked from being deposited. Such shadow gap patterns can then be transferred into the underlying substrate 13 by reactive ion or chemical etching in a direction of arrows 31.

In reality the etching action progresses in all directions and is inhibited at the surface by the masking film 22 and inhibited by the availability of material of the substrate 13 for reaction in the region of the gap(s) 28. Thus, the trench(es) 34 (shown in FIG. 1C) may be at least partially reentrant, as indicated by dashed line 35. Using mainstream microfabrication techniques, such as reactive ion etching, keeps costs low. On the other hand, DNA shadow nanolithography (DSN) or other cylindrical structure shadow nanolithography processes can be utilized to generate straight, curved, linear, and/or branched trenches with width dimensions 37 as narrow as 7 nm. In other embodiments, with some cylindrical structures and by using predetermined angles of masking, width dimensions 37 of 10, 9, 8, 7, 6, 5, 4, 3 nanometers, or less, (or any dimension within this range) can be achieved. When DNA or other uniform material is used at the template, the features can be made to have uniform features such as substantially straight and/or parallel walls. Trenches 34 can be formed having width dimensions 37 of forty-five nm or less, thirty nm or less, twenty nm or less, fifteen nm or less, or any value within these ranges. Other nano-templating elements may be utilized in addition to or in place of the cylindrical structures described herein. For example, nanostructures having generally semicylindrical or non-uniform cross sectional configurations may be utilized for templating.

Figure 2A:
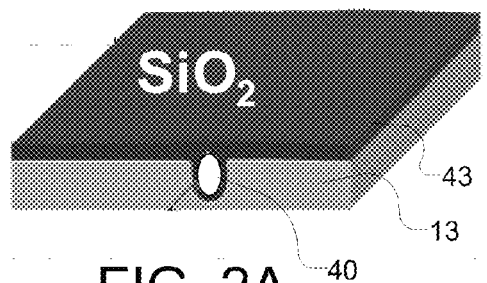
FIGS. 2A-2B are diagrammatic perspective views illustrating alternative embodiments of the apparatuses and corresponding operations of the method.
Figure 2B:
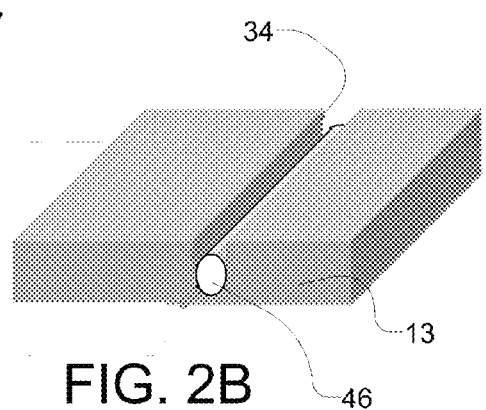

FIGS. 2A-2B are diagrammatic perspective views illustrating alternative embodiments of the apparatuses and corresponding operations of the method. The masking film 22 may be removed, as shown in FIG. 1C. In one embodiment, the trenches 34 can then template the formation of nanocapillaries 40, as shown in FIGS. 1C-2A. The embodiment of FIG. 2A includes enclosing a top of the trench 34 by a layer 43 of silicon or other material to close an opening of the trench(es) 34. In another embodiment, the trenches can template electroless deposition of metal nanowires 46, as shown in FIG. 2B. Electroless deposition of metal may be undertaken before or after the mask film 22 has been lifted off.

Figure 3:
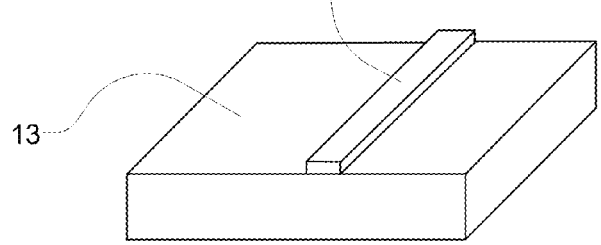
FIG. 3 is a diagrammatic perspective view illustrating another alternative apparatus embodiment and another operation of the method.

FIG. 3 is a diagrammatic perspective view illustrating another alternative apparatus embodiment and another operation of the method. FIG. 3 shows an application in which the gaps 28 or gap pattern(s) of FIG. 1B are nano-chemically patterned instead of etched. That is, a reactive process deposits a reactive chemical species 49 on the substrate 13 to form a raised nano feature or pattern. This operation of nanochemical patterning is performed prior to removal or lift off of the mask film 22.

Whether through etching by an etching agent that reacts with and removes material from the substrate or by chemically modifying such as by adding material through nanochemical patterning, a patterned or textured substrate is left after lift off of the film 22. Alternatively or additionally, a non-chemical sputtering operation may be undertaken to apply a material or pattern of the material in exposed areas of the substrate. In any case, the nanofeatures, including nanotrenches 34, nanochannels or nanocapillaries 40, and/or added material 49, have walls formed in a manner that preserves wall and material integrity. These walls are formed by chemical or other processes that remove or add material in an unabrasive manner such that the walls and underlying material remain unscathed. Thus, these walls are unscathed or unabraded. As such, the wall surfaces and underlying material are preserved and have improved solidity and wholeness when compared with nanofeatures formed by more abrasive methods such as electron beam lithography or scanning probe lithography, for example.

While the processes of FIGS. 1A-3 have been shown and described more generally above, the process also specifically applies to the DSN process. DNA molecular objects (molecules, bundles, self-assembled networks, etc.) may be aligned on a surface of the substrate 13. The orientation of these objects may be effectuated by atomic force microscopy (AFM) and/or more typically by other methods such as fluid flow or surface tension forces. Then, a metal film 22 with good substrate adhesion and small grain size (e.g., Al or Cr) is vapor deposited at an acute angle 25 relative to the surface. The acute angle may be in a range from fifteen to seventy-five degrees. The resulting film 22 has nanometer-sized gaps corresponding to molecular shadows. Anisotropic etching may be utilized to transfer this pattern into the substrate 13 in the form of trenches. Other variants of DSN could achieve pattern transfer by using the metal film as a protective layer during chemical functionalization of the exposed substrate lines or gaps 28. For example, one or more chemical species 49 may be added to the substrate in regions of the gap(s) 28 through a reactive process to form raised nanofeatures, as shown in FIG. 3.

Figure 4:
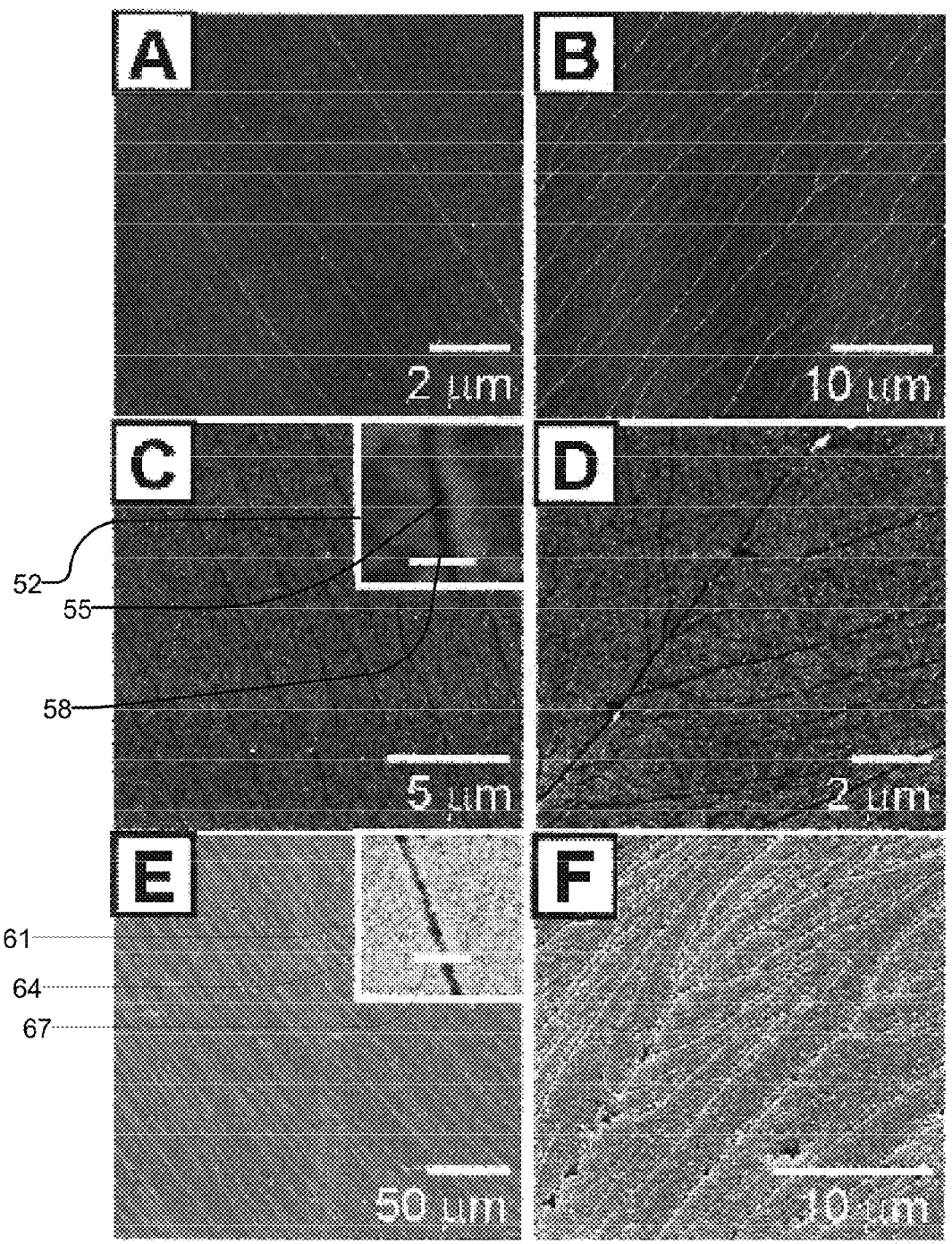
FIG. 4 is a series of instrument-produced images illustrating top plan views of substrates treated in accordance with embodiments of the method to produce the apparatuses in accordance with embodiments of the present invention.

FIG. 4 is a series of instrument-produced images illustrating top plan views of substrates treated in accordance with embodiments of the method to produce the apparatuses in accordance with embodiments of the present invention. FIG. 4 shows AFM and scanning electron microscopy (SEM) images of DNA-bearing silicon substrates before and after DSN, using plasma etching to transfer the DNA pattern into the surface of the substrates, as shown in panels A-F. Experiments with branching DNA bundles shown in panels D and F indicate that two-dimensional patterns can be generated if the features of the DNA bundles are less than approximately 45° from parallel to the direction of the metal deposition relative to the substrate.

Spatial resolution in DSN is determined by a combination of factors, including the height of the DNA template or object, the quality of the metal film and the nature of the pattern transfer step. Referring back to FIGS. 1A-1C, the width of the DNA shadow corresponding generally to the width 37 of the trench in FIG. 1C, (width w) on the substrate depends on the evaporation angle corresponding to the angle 25 shown in FIG. 1A, (angle q). According to a first approximation, $w=h/\sin(q)$, where h is the height of the DNA object. However, in some cases it was found experimentally that the geometric model underestimates width w (width 37 in FIG. 1C) by a factor of up to 2.5 for calculated $w \leq 4$ nm. The spatial resolution limit of DSN is in part imposed by the grain size of the metal deposited to form the mask film 22, and in part by broadening that occurs during pattern transfer onto the substrate. Using Al or Cr films, continuous, well-defined molecular shadows in a range from 7 to 20 nm wide can be formed routinely for angle 25 (FIG. 1A) in a range from 15° to 30° and a height h of the DNA object in a range from 2 to 4 nm. Values of the angle 25 less than 15° give wider shadows ($\geq 30$ nm) even for single, unbundled DNA molecules. On the other hand, experiments with angle 25 as large as 60° give measurable shadows (gaps 28 in the masking film 22 shown in FIG. 1B) having widths 37 less than 7 nm on occasion. Using even higher values of angle 25 for the deposition of the mask film 22 generally results in either discontinuous rows of pits having widths in a range from 2 to 3 nm wide, or in no discernable pattern transfer.

The image panels of FIG. 4 show experimental examples of transfer of linear and branched DNA patterns to silicon surfaces by DSN. AFM of surface-aligned linear DNA bundles is shown in panel A. AFM of surface aligned branched DNA bundles is shown in panel B. Panel C shows AFM of a 4 nm thick Al film and panel D shows AFM of a 4 nm thick Cr film each on silicon and showing DNA shadows. (The Z scale is 10 nm for all AFM images.) The inset 52 in panel C of FIG. 4 is a close-up zoom of a trench 55 that is narrow in comparison to a scale bar 58 of a length of fifty nm. Panels E and F in FIG. 4 show SEM micrographs of linear and branched nanometer-scale trenches, respectively, etched into silicon. The inset 61 in panel E is a close-up zoom of a trench 64 in comparison with a scale bar 67 of length fifty nm. The trenches shown in panel E have widths of approximately 8 nm.

For successful pattern transfer by plasma etching, it was found that at least in some cases the thickness of the metal film must be less than or equal to twice the height of the DNA object. Thicker films perform better as etch masks and allow the creation of higher aspect ratio structures in and/or on the substrates. However, utilizing thicker films increases the risk of covering up finer DNA features when, for example, DNA objects having different heights are present on the surface of the substrate. Trenches with aspect ratios of up to approximately 15 can be readily created by using 3 nm thick Al etch masks. Nanofeatures including trenches having aspect ratios of up to 25 can also be achieved. The spatial resolution, achievable depth of etched features, and achievable height of nano-chemical patterning depend strongly on the quality of the metal etch mask. A high quality may be maintained in the mask film by depositing the mask material via thermal evaporation from a line source at 0.5 Å/s and base pressures less than $2 \times 10^{-6}$ torr. Higher base pressures render films with numerous pinholes that result in poor etch masks.

Figure 5:
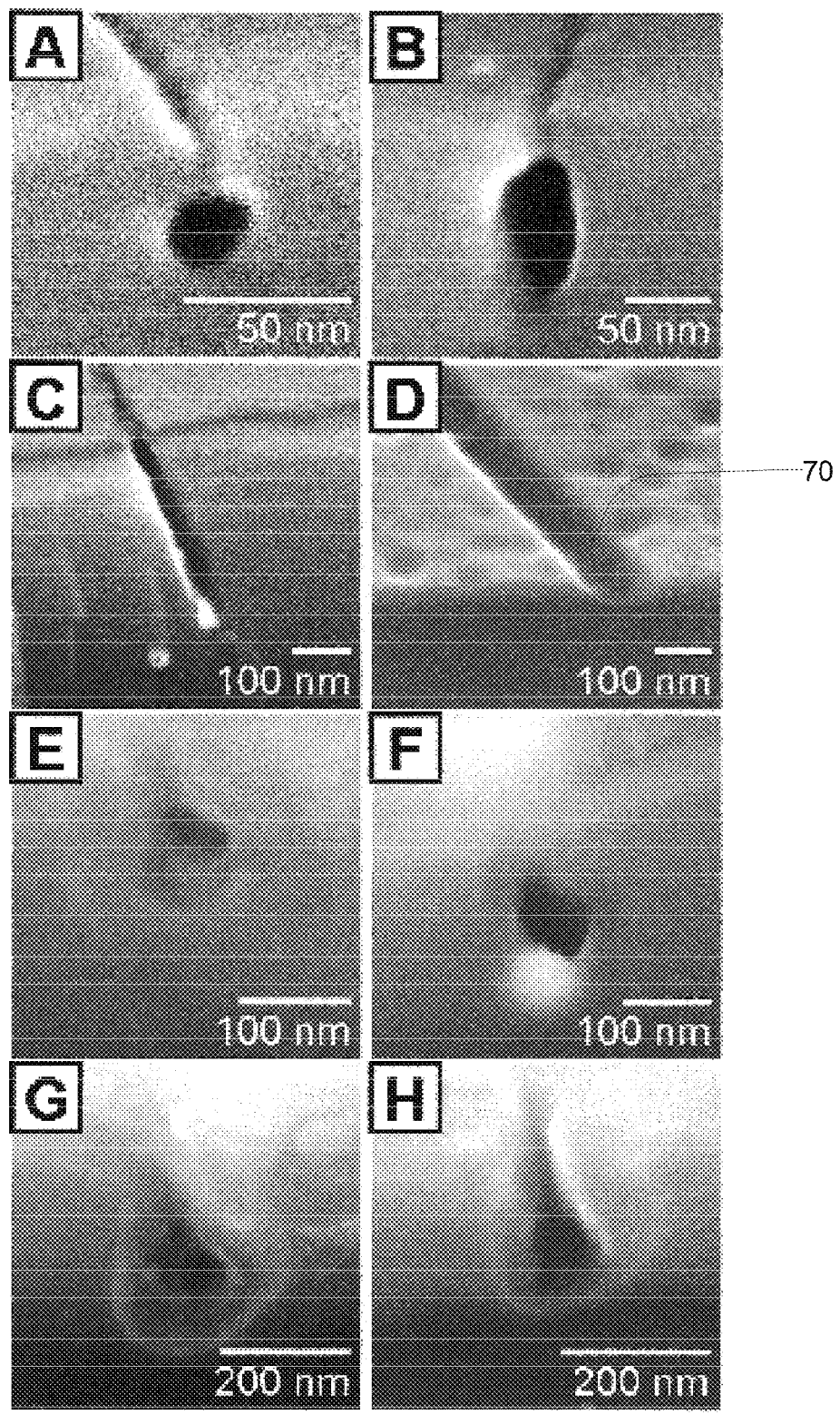
FIG. 5 is a series of instrument-produced images illustrating partial sectional, sectional, and end views of apparatuses including nanofeatures formed in substrates in accordance with embodiments of the method.

FIG. 5 shows a series of instrument-produced images illustrating partial sectional, sectional, and end views of apparatuses including nanofeatures formed in substrates in accordance with embodiments of the method. Etching of DSN-patterned silicon substrates may be performed in an inductively coupled plasma reactive ion etcher (ICP-RIE) using a mixture of $C_4F_8$ and $SF_6$ as etching agents. For the same coil power and etching time (typically 3 min), higher $C_4F_8$ content yields shallower trenches with more vertical sidewalls. The sidewall profile is more strongly influenced by width w, (corresponding to the trench width 37 at the surface, as shown in FIG. 1C). For widths 37 less than 10 nm, trenches formed in accordance with the etch described above are relatively shallow and have rounded sidewalls as shown in the partial sectional view of panel A in FIG. 5. The result is that a width in a bottom portion of the trench is significantly wider than the width at the surface. Thus, the trench may be described as having a reentrant cross section. For trenches formed with widths at the surface of the substrate in a range from 10 to 20 nm, the rounding and broadening effect is lessened, and trench depth increases substantially. This is shown in the partial sectional view of panel B in FIG. 5. For widths 37 (or gaps 28) at the surface of the substrate that are greater than 20 nm, the sidewalls are typically straight, as shown in the partial sectional view of panel C in FIG. 5. However, some reentrant structure is created by the etch, as can be observed in the trenches of FIG. 5.

In the etched trench shown in panel C, the trench depth approached 70% of the value obtained in control experiments with micron-scale line widths. The etch rate and sidewall profile are dependent on the trench width due to a reduction in the flux of ions and etching species into the trench with decreasing trench width, which has been described by others as RIE lag. The constriction observed at the top of the trenches in FIG. 5, panels A-C, is also due to this reduction in the flux of ions and etching species into the trench with decreasing trench width. Panel D of FIG. 5 is a partial sectional view showing the effect of DSN on thermally oxidized silicon using buffered oxide etchant for isotropic pattern transfer. The semicylindrical cross section of the trench 70 is the result of undercutting in which the etchant removes material from the substrate along an underside of the masking film nearest to the shadow gap. This undercutting action results in a trench having wider hemicylindrical features. However, the results from performing DSN on a substrate of a different material and using a different etchant, as shown in panel D of FIG. 5 demonstrates that DSN can be generalized to pattern substrates of any of a variety of materials. Any of a variety of etching methods and etchants may also be used. Examples of other substrate materials on which the nanofeatures may be placed in accordance with embodiments of the present invention include silicon, glass, quartz, plastics, gallium arsenide, gallium nitride, semiconductors, insulators, metals, and combinations thereof.

While much of the present description is set forth in terms of DNA templates having substantially cylindrical structures, it is to be understood that other materials having cylindrical or other cross sectional configurations may be used to create the template(s) or provide the nano-templating elements in accordance with embodiments of the present invention. For example, carbon or other nanotubes may be used to form the templates for forming nanofeature(s) or nano object(s) in accordance with embodiments of the present invention. Other nano-templating elements that may be utilized include ceramic or metallic nanowires, which may have generally cylindrical or other cross sectional configurations. Alternatively or additionally, other naturally occurring materials such as nucleic acids or parts thereof may be utilized.

Figures 6, 7:
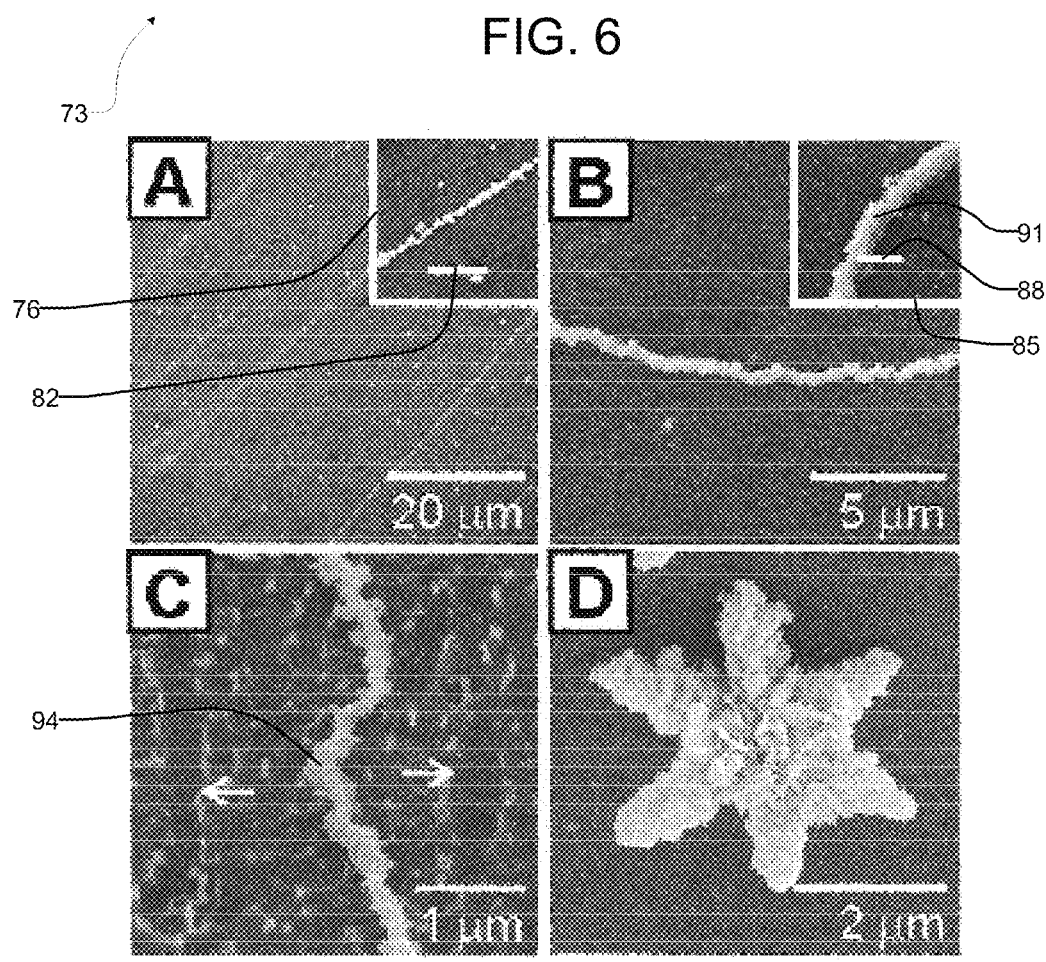
FIG. 6 is a table illustrating relationships of widths and depths of nanotrenches taken from some of the images of FIG. 5.
FIG. 7 is a series of instrument-produced images illustrating top plan views of substrates including some substrates treated in accordance with embodiments of the method to produce nanowires.

FIG. 6 is a table 73 illustrating relationships of widths and depths of nanotrenches taken from some of the images of FIG. 5. The table 73 presents comparisons of the dimensions of the etched trenches shown in panels A-C of FIG. 5. The numbers indicate that the trenches in panels A-C are re-entrant. The depth increases for increased top width, as noted in the comparison of panels A and B. Furthermore, the maximum width is proportionally less as the top width increases.

The variations in depth and maximum width that are dependent on other adjustable factors show how DSN provides the opportunity to customize nanotrenches for particular applications. Furthermore, the nanofeatures created by DSN can be tailored to specific applications using standard microfabrication tools. Referring back to FIG. 5, for example, panels E-F display end view images of closed nanotrenches or nanocapillaries. These nanocapillaries are formed by closing a narrow neck portion of the top widths of small, rounded sidewall trenches. This may be achieved by growing of a thin layer of dry thermal oxide to close or cleave an opening in the surface of the substrate. Panel G of FIG. 5 is a cross sectional view showing a similarly cleaved nanotrench, with the silica cleaving layer having somewhat different color or shading from the non-oxidized silicon of the substrate. By way of comparison, panel H of FIG. 5 is a cross sectional view showing a top width opening of a wider trench that failed to close completely due to insufficient oxide growth.

The trenches formed in accordance with embodiments of the present invention may have any length from a few nanometers to hundreds of nanometers. The lengths may extend in ranges from hundreds of nanometers to at least 15 micrometers (the approximate length of the λ-DNA template) or more. The continuity and length of DNA-templated nanocapillaries may facilitate chemical sensing on a nanoscale level or provide structures for nanofluidics applications.

Referring back to FIGS. 1A-1B and 2B, in another application of DSN described generally above, after the stage shown in FIG. 1B, a substrate 13 can be utilized to template the deposition of one or more metal nanowires 46, as is diagrammatically shown in FIG. 2B. The trenches may be filled with any of a variety of metals, including nickel, copper, gold, and silver. In other embodiments a ceramic material may be utilized to form a ceramic nanowire. Under predetermined plating conditions electroless deposition of silver creates relatively small grain sizes. Preliminarily, walls of the substrate that will receive the metal for forming the wire need to be functionalized. In this case, the walls of the trench 34 may be functionalized in the silicon substrate with aminosilanes to activate the trench walls for metal deposition. The top of the silicon substrate 13 remains protected by the metal etch masking film 22. Very slow electroless deposition (typically 16 hrs for example) may be performed. Subsequent to deposition of the nanowire metal material, a liftoff operation is implemented to remove excess plated metal material through dissolution of the underlying etch masking film 22. It is noted that the same operations may be applied to plural walls of a plurality of DSN-patterned trenches forming one or more nano objects, for example. The one or more nano objects can then be utilized to localize other structures, bind other chemicals, etc.

FIG. 7 is a series of instrument-produced images illustrating a top plan view of substrates including some substrates treated in accordance with embodiments of the method to produce nanowires. FIG. 7, panels A-D show a variety of top plan views of large-area SEM images with chains of silver nanoparticles having diameters of approximately fifty to one hundred nm. Panels A-C show the silver nanoparticles deposited in and growing out from nanotrenches. These deposited nanoparticles demonstrate how nanowires can be formed. Even though the trenches in panels A to C are a much larger scale than the trenches discussed with regard to FIGS. 1A-6, the same principles of deposition and formation of continuous wires may be applied to the smaller trenches. Panel A has an inset 76 showing a close-up zoom of a region having silver nanoparticles 79 deposited in a trench. The scale 82 measures approximately 2 micrometers. Thus, a width of the deposited particles can be generally ascertained.

In panel B, KOH etching of the silicon to near a level of the bottom of the trenches shows that continuous, nanocrystalline silver lines or nanowires are formed therein. An inset 85 in panel B shows a close-up zoom of a region of an image with a scale 88 having a length of 500 nm such that a width of the deposit of silver nanoparticles forming a continuous nanowire 91 is approximately 200 nm. This investigative etching weakens the adhesion of the silver nanowires to the silicon substrate, such that many of the nanowires are lifted off during rinsing. In some cases, a surface of the etched substrate shows evidence of removed nanowires, as indicated by arrows pointing at empty trenches to the right and left of a nanowire 94 in a trench shown in panel C. Panel D shows the result of a control experiment on a non-templated substrate, demonstrating that the electroless silver plating bath and operation on the non-templated substrate produces significantly larger deposits with morphologies that are different from DSN-fabricated silver lines. Nevertheless, applying the same principles and optimizing electroless plating operations for smaller scale trenches can be implemented to form nanowires in trenches formed by DSN on substrates like those described in this application. Since the substrates form insulators between the trenches, formation of nanowires in trenches can be extended to the fabrication of arrays of metal nanowires.

In any case, the utilization of surface-aligned DNA molecules as shadow mask templates in a nanolithography approach in accordance with embodiments of the present invention is capable of achieving a spatial resolution in the sub-10 nm range. Using DSN, DNA patterns of varied complexity can be transferred to a substrate with high fidelity, and post-processed in parallel by standard chemical or microfabrication methods implemented to add functionality to the nanofabricated structures. Nanotrenches having high aspect ratios, enclosed nanotrenches, and continuous metal lines or nanowires can be formed on silicon by DSN in accordance with embodiments of the present invention. Nanostructures or nano objects having nano-chemical elements or patterns can additionally or alternatively be formed on silicon. These nanostructures may be applied in a variety of nano system devices and/or may be used to provide nanofluidic channels or chemical sensors. It is to be understood that non-metallic nanowires may be provided by placing ceramic and/or other material in nanotrenches. Furthermore, it is to be understood that the nano-templating elements to be placed on the substrate for shadowing may be of any configuration including non-cylindrical and non-DNA structures.

The schematic flow chart diagrams that follow are generally set forth as logical flow chart diagrams. As such, the depicted order and labeled operations are indicative of one embodiment of the presented method. Other steps and methods may be conceived that are equivalent in function, logic, or effect to one or more operations, or portions thereof, of the illustrated method. Additionally, the format and symbols employed are provided to explain the logical operations of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated operations of the depicted method. Additionally, the order in which a particular method occurs may or may not strictly adhere to the order of the corresponding operations shown.

Figure 8:
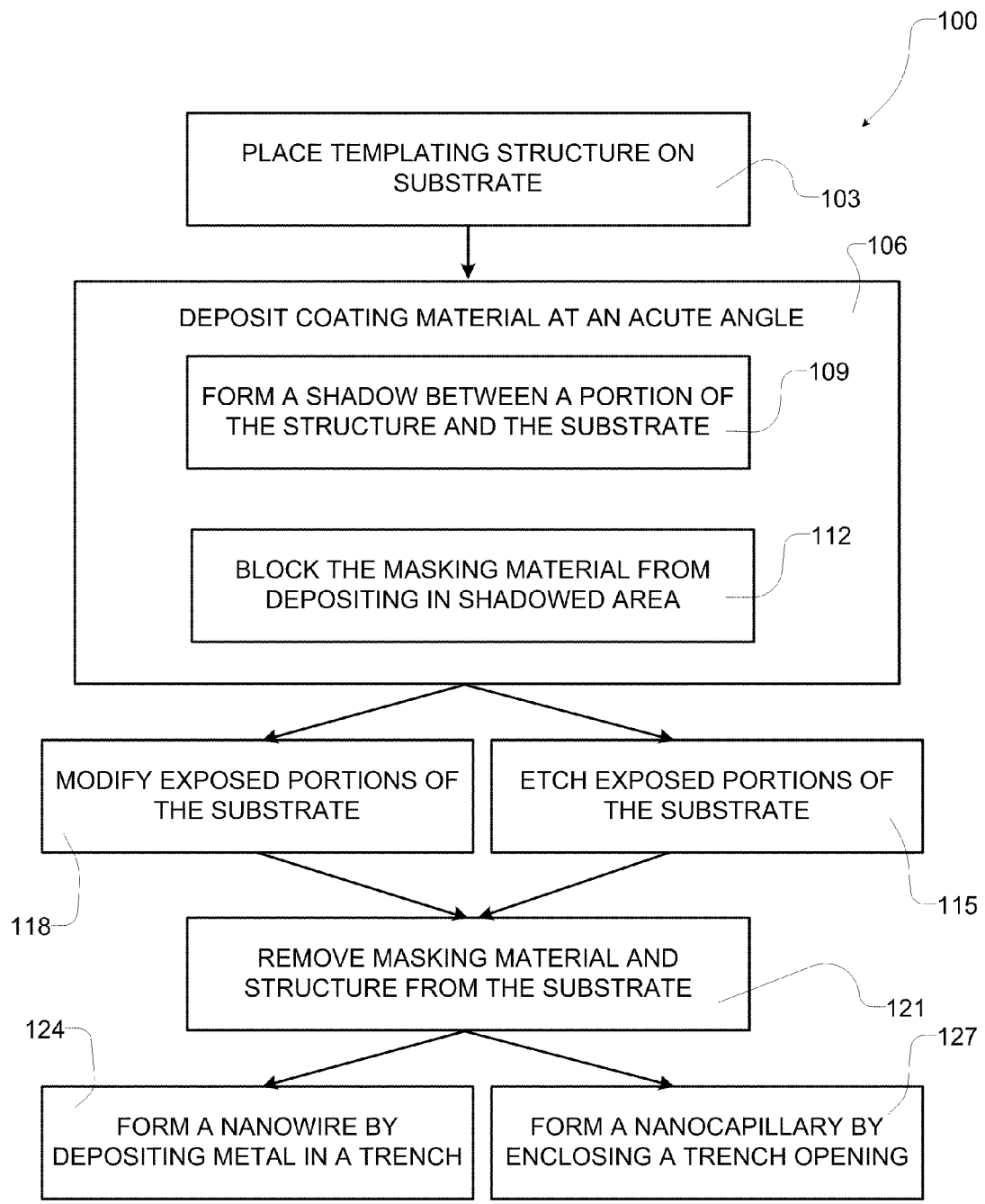
FIG. 8 is a block diagram showing operations in an embodiment of a method of forming nanofeatures in a substrate.

FIG. 8 is a block diagram showing operations in an embodiment of a method 100 of forming nanofeatures in a substrate. The method 100 includes performing shadow nanolithography. Initially, a nanoscale cylindrical polymeric structure or other nanoscale element of any shape is placed on a substrate, as indicated at 103. It is to be understood that a plurality of nanoscale elements may be selected to provide a template of a desired configuration or pattern. A masking material is deposited in a direction of travel at an angle between zero and ninety degrees relative to a surface on which the nanoscale element has been placed to create a coating or film over the surface and the nanoscale element, as indicated at 106. The masking material may be applied at an angle in a range from fifteen to seventy-five degrees. Alternatively, the masking material may be applied at an angle in a range from thirty to sixty degrees, or at any angle within these ranges. A shadow is formed on the substrate by the angle at which the masking material is applied, as indicated at 109. That is, the nanoscale element blocks or inhibits the masking material from being deposited in a shadowed area on the substrate, as indicated at 112. As may be appreciated, the operations of forming a shadow 109 and blocking the masking material 112 are included in the operation of depositing the masking material 106. Implementation of these operations leaves at least one gap in a film or coating formed by the masking material. Forming one or more gaps in this manner is undertaken to form the gap(s) in a configuration or pattern corresponding to the configuration or template of the nanoscale element(s) initially placed on the substrate. Thus, the nanoscale element(s) are nano-templating element(s).

Another operation in accordance with the method of performing shadow nanolithography includes etching portions of the substrate that are exposed through the gap(s) in the masking material, as indicated at 115. The method 100 alternatively includes chemically modifying the substrate in regions corresponding to the gap(s), as indicated at 118. This operation may include nano-chemically patterning the substrate and/or functionalizing one or more regions corresponding to the gap(s).

Another operation of the method 100 includes removing the masking material and/or the nanoscale element, which may be an approximately cylindrical structure, as indicated at 121. Other operations may include forming a nanowire by placing metal in a trench formed by the etching operation as indicated at 124, and forming a nanocapillary by cleaving a trench opening, as indicated at 127. It is to be understood that the operation of removing the masking material 121 may be implemented before or after forming the nanowire 124. The method 100 includes forming a plurality of nanowires, nanotrenches, and/or nanocapillaries into predetermined patterns or array(s) in order to form nano objects or nanodevices in nanosystems.

It is to be understood that the operation of placing a nanoscale element on the substrate 103 may take the form of placing one or more DNA molecule or other nucleic acid material on the substrate. In this way, the method includes a method for performing DNA shadow nanolithography. In one embodiment, the method includes placing a protein-decorated DNA template (eg., linear, branched or assembled pattern) on the substrate. This protein-decorated DNA can thus be used as a nano-templating element for DNA shadow nanolithography. Alternatively or additionally, these DNA templates can be modified by decorating the DNA with carbon nanotubes, metal nanoparticles, semiconductor nanoparticles, and other materials selectively deposited on the DNA through DNA-basepairing, other biochemical interactions, electroless plating, etc. Decorated DNA templates can achieve greater patterning capabilities, for example, by incorporating height or width variations at predetermined locations on the template. Alternatively the same principle may be applied by placing non-DNA nano elements on the substrate for templating.

Experimental Details

DNA Alignment: Hydrophobic silicon surfaces may be used to favor the formation of DNA bundles. One square cm pieces of p type silicon <100> wafers (TTI Silicon, Sunnyvale, Calif.) may be cleaned using piranha solution, rinsing them with purified F c water from an Easypure UV/UF system (Barnstead, Dubuque, Iowa), and drying them under a stream of nitrogen. The substrates may be baked at 130° C. for 1 hr, and then exposed to chlorodimethyloctadecylsilane (Aldrich, St Louis, Mo.) vapor for 30 min in an oven at 90° C. The wafers may be removed from the oven and soaked in acetone for 30 min, followed by rinses with acetone, isopropanol and purified water.

The DNA may be λ DNA (New England Biolabs, Ipswich, Mass.) aligned on the hydrophobic silicon substrates by translation or wicking of a 1-4 μL droplet of a λ DNA solution in 10 mM Tris, 1 mM EDTA (both from Life Technologies, Grand Island, N.Y.), pH 8.0. DNA concentrations of 1-5 ng/µL may be used to produce aligned individual DNA molecules, whereas DNA bundles may be formed by using concentrations in the 25-50 ng/µL range. Finally, the aligned DNA substrates may be rinsed with purified water and dried under a stream of nitrogen.

Atomic Force Microscopy: Tapping mode height images may be collected with a Multimode IIIa AFM (Veeco, Sunnyvale, Calif.) using microfabricated, aluminum coated silicon cantilever tips (Nanoscience Instruments, Phoenix, Ariz.). An active isolation system (MOD1-M, Halcyonics, Goettingen, Germany) may be used to dampen out vibrational noise. Imaging parameters may be: tip resonance frequency, 50-70 kHz; free oscillation amplitude, 0.9-1.1 V; amplitude setpoint, 0.5-0.8 V; and scan rate, 0.4-1.4 Hz. The images may be processed offline to remove background curvature.

Scanning Electron Microscopy: Secondary electron SEM images may be recorded using a Phillips XL30 Environmental SEM with a field emission gun. Substrates may be imaged in high-vacuum mode without any conductive coating.

Thermal Evaporation of Metal Films: A CHA-600 triple-source thermal evaporator (CHA Industries, Fremont, Calif.) fitted with a stationary, planar holder may be used, and leveled carefully. The DNA bearing silicon squares may be oriented by placing them on polymer supports cut to angles in the 15° to 75° range, and placed directly above the metal source at a ~40 cm distance. When the pressure is less than $2 \times 10^{-6}$ torr, ~4 nm of either Al or Cr may be deposited on the substrates at 0.5 Å/s.

ICP-RIE Process: An ICP-RIE tool from Surface Technology Systems (Newport, UK) may be used for etching. The metal masked silicon samples may be etched with $C_4F_8$ and $SF_6$. Typical etch conditions are given below:

The $C_4F_8$ gas flow rate may be 30-130 sccm (cubic centimeters per minute at standard temperature and pressure); the flow rate for $SF_6$ may be 50 sccm. Coil power may be 800 W, platen power may be 200 W, and the platen may be cooled to 10° C. with flowing helium. The base pressure may be $\sim 2 \times 10^{-7}$ torr, and the etching pressure may be ~10 mtorr. The etch time may be 1-4 minutes.

All etched samples may be cleaned for 30 s in a 200 W, 10 sccm $O_2$ oxygen plasma (PE-II, Technics, Danville, Calif.) to remove any surface contamination. X-ray photoelectron spectroscopy, AFM, and SEM may be used to verify that this cleaning does not damage the metal films.

Oxidation of Silicon Substrates: Silicon substrates with DSN patterned nanotrenches may be oxidized inside a Lindberg/Blue M tube furnace (Asheville, N.C.) at 800-1100° C. for 10-120 minutes with $O_2$ flow of 700 sccm.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A nanostructure comprising:
   a substrate;
   a DNA formation extending outward from a surface of the substrate, the formation forming a shadow gap on the substrate;
   at least one nanofeature formed in the shadow gap; and
   the nanofeature having a width dimension in a range from 5 to 45 nanometers, the nanofeature comprising an unscathed wall.

2. The nanostructure of claim 1, wherein the width dimension is in a range from 10 to 30 nanometers.

3. The nanostructure of claim 1, wherein the width dimension is in a range from 5 to 10 nanometers.

4. The nanostructure of claim 1, wherein the DNA formation comprises a pattern of nano elements corresponding to a linear DNA template.

5. The nanostructure of claim 1, wherein the DNA formation comprises a pattern of nano elements corresponding to a branched DNA template.

6. The nanostructure of claim 1, wherein the DNA formation comprises a pattern of nano elements corresponding to an assembled DNA nanostructure object.

7. The nanostructure of claim 1, wherein the nanofeature comprises an aspect ratio of depth to width greater than 3 to 1.

8. The nanostructure of claim 1, wherein the nanofeature further comprises walls forming a reentrant opening in the substrate.

9. A nano system device, comprising:
   a DNA structure extending outward from a surface of a substrate, the structure forming a shadow gap on the substrate;
   at least one nanofeature formed in the shadow gap with a width dimension less than 45 nanometers; and
   wherein the nanofeature includes an unscathed wall.

10. The nano system device of claim 9, wherein the nanofeature comprises a nanowire having a width less than 10 nanometers.

11. The nano system device of claim 9, wherein the nanofeature comprises a nanotrench having a width less than 10 nanometers.

12. The nano system device of claim 9, wherein the nanofeature comprises a nanocapillary having a width less than 10 nanometers.

13. The nano system device of claim 9, wherein the nanofeature comprises a chemically patterned nanofeature having a width less than 10 nanometers.

14. The nano system device of claim 9, further comprising a sensor, wherein the nanofeature forms at least a portion of a sensor.

15. The nano system device of claim 9, further comprising nanocircuitry, wherein the nanofeature forms at least a portion of nanocircuitry in a nano system device.

16. The nano system device of claim 9, wherein the nanofeature further comprises walls forming a reentrant opening in a substrate.

* * * * *